(12) United States Patent
Wong et al.

(10) Patent No.: US 7,501,299 B2
(45) Date of Patent: Mar. 10, 2009

(54) METHOD FOR CONTROLLING THE STRUCTURE AND SURFACE QUALITIES OF A THIN FILM AND PRODUCT PRODUCED THEREBY

(75) Inventors: William S. Wong, San Carlos, CA (US); Michael A. Kneissl, Berlin (DE); Mark Teepe, Menlo Park, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 435 days.

(21) Appl. No.: 11/356,699

(22) Filed: Feb. 17, 2006

(65) Prior Publication Data
US 2007/0111345 A1    May 17, 2007

Related U.S. Application Data

(60) Provisional application No. 60/736,362, filed on Nov. 14, 2005, provisional application No. 60/736,531, filed on Nov. 14, 2005.

(51) Int. Cl.
*H01L 21/00* (2006.01)
(52) U.S. Cl. .............................. 438/31; 438/22; 438/29
(58) Field of Classification Search ......... 438/690–693, 438/697, 626, 631, 645, 646, 698, 699, 760, 438/22–47; 257/22, 80, 94, 103, E33.028, 257/E33.03
See application file for complete search history.

(56) References Cited

U.S. PATENT DOCUMENTS

| | | | | |
|---|---|---|---|---|
| 4,676,868 A * | 6/1987 | Riley et al. | ................. | 438/697 |
| 5,512,163 A * | 4/1996 | Warfield | ..................... | 438/692 |
| 5,578,839 A | 11/1996 | Nakamura et al. | | |
| 6,078,064 A | 6/2000 | Ming-Jiunn et al. | | |
| 6,107,644 A | 8/2000 | Shakuda et al. | | |
| 6,365,429 B1 | 4/2002 | Kneissl et al. | | |
| 6,455,340 B1 * | 9/2002 | Chua et al. | ..................... | 438/31 |
| 6,456,640 B1 | 9/2002 | Okumura | | |
| 6,617,261 B2 | 9/2003 | Wong et al. | | |

(Continued)

OTHER PUBLICATIONS

Vaudo et al., *GaN Boule Growth: A Pathway To GaN Wafers With Improved Material Quality*, Physica Status Solidi A, v 194, n 2, Dec. 2002, p. 494-7, ISSN: 0031-8965, CODEN: PSSABA.

*Primary Examiner*—Michael S. Lebentritt
*Assistant Examiner*—Karen M Kusumakar
(74) *Attorney, Agent, or Firm*—Jonathan A. Small

(57) ABSTRACT

A system and method for providing improved surface quality following removal of a substrate and template layers from a semiconductor structure provides an improved surface quality for a layer (such as a quantum well heterostructure active region) prior to bonding a heat sink/conductive substrate to the structure. Following the physical removal of a sapphire substrate, a sacrificial coating such as a spin-coat polymer photoresist is applied to an exposed GaN surface. This sacrificial coating provides a planar surface, generally parallel to the planes of the interfaces of the underlying layers. The sacrificial coating and etching conditions are selected such that the etch rate of the sacrificial coating approximately matches the etch rate of GaN and the underlying layers, so that the physical surface profile during etching approximates the physical surface profile of the sacrificial coating prior to etching. Following etching, a substrate is bonded to the exposed surface which acts as a heat sink and may be conductive providing for backside electrical contact to the active region.

4 Claims, 16 Drawing Sheets

U.S. PATENT DOCUMENTS

| | | |
|---|---|---|
| 6,744,800 B1 | 6/2004 | Kneissl et al. |
| 6,757,314 B2 | 6/2004 | Kneissl et al. |
| 6,864,502 B2 | 3/2005 | Shibata et al. |
| 6,865,202 B2 | 3/2005 | Matsumoto |
| 6,875,627 B2 | 4/2005 | Bour et al. |
| 6,875,629 B2 | 4/2005 | Senda et al. |
| 6,881,601 B2 | 4/2005 | Sugawara |
| 6,898,226 B2 | 5/2005 | Otoma et al. |
| 6,949,140 B2 | 9/2005 | Sarayama et al. |
| 2005/0269577 A1* | 12/2005 | Ueda et al. .................. 257/80 |

* cited by examiner

METHOD FOR CONTROLLING THE STRUCTURE AND SURFACE QUALITIES OF A THIN FILM AND PRODUCT PRODUCED THEREBY

CROSS-REFERENCE TO RELATED APPLICATIONS

The present invention is related to provisional U.S. Applications for Letters Patent titled "Superlattice Strain Relief Layer For Semiconductor Devices", Ser. No. U.S. 60/736,362, and "Method For Controlling The Structure And Surface Qualities Of A Thin Film And Product Produced Thereby", Ser. No. U.S. 60/736,531, each filed on Nov. 14, 2005, each assigned to the same assignee as the present application, and each being incorporated by reference herein.

BACKGROUND OF THE INVENTION

1. Field of the Invention

The present invention is related generally to the field of solid state light emitting diode and laser fabrication, and more particularly to techniques for controlling the structure and surface qualities of layers of such structures for improved device performance, reliability, and lifespan.

2. Description of the Prior Art

In the III-V compound semiconductor family, the nitrides have been used to fabricate visible wavelength light emitting diode and laser active regions. They also exhibit a sufficiently high bandgap to produce devices capable of emitting light in the ultraviolet, for example wavelengths between 300 and 400 nanometers. In particular, InAlGaN systems have been developed and implemented in visible and UV spectrum light emitting diodes (LEDs), such as disclosed in U.S. Pat. No. 6,875,627 Bour et al., which is incorporated herein by reference. These devices are typically formed on an $Al_2O_3$ (sapphire) substrate, and comprise thereover a GaN:Si or AlGaN template layer, an AlGaN:Si/GaN supperlattice structure for reducing optical leakage, an n-type electrode contact layer, a GaN n-type waveguide, an InGaN quantum well heterostructure active region, and a GaN p-type waveguide region. In addition, the complete device may also have deposited thereover a p-type AlGaN:Mg cladding layer and a capping layer below a p-type electrode.

While significant improvements have been made in device reliability, optical power output, and mode stability, the performance of the nitride-based light emitting diode emitting in the ultraviolet (UV) is still far inferior to that of blue or green light emitting devices. It is particularly true that for the UV light emitting devices, the nature of the substrate and template layer have a critical impact on the overall device performance. For example, electrical resistance between the structural layers of the device significantly effects optical output. While $Al_2O_3$ (sapphire) as a substrate has numerous advantages, the AlGaN template layer formed over the typical $Al_2O_3$ substrate posses high series resistance due to limited doping capabilities. Furthermore, the crystallographic structure of the device layers plays a key role in the device's operational characteristics, and the AlGan template layer provides a relatively poor crystalline template.

The dislocation densities in AlGaN or AlN template layers on sapphire are typically in the mid $10^9$ to high $10^{10}$ cm$^{-2}$ range. As a consequence, the external quantum efficiencies of deep UV light emitting diodes in the 250 nm to 350 nm range are still below 2% even for the very best devices (external quantum efficiencies near 50% have been demonstrated for blue GaN-based LED structures). The high dislocation densities in AlGaN or AlN template layers on sapphire also pose significant problems for the light emitting diode device lifetimes.

GaN epitaxial layers on sapphire substrates have proven to be a preferred template for InAlGaN film growth, providing excellent optoelectronic quality for visible light emitting diode devices and reasonable dislocation densities. The dislocation densities in GaN template layers on sapphire are typically in the low $10^9$ to mid $10^7$ cm$^{-2}$ ranges. Accordingly, sapphire with a GaN template layer is the preferred foundation for visible GaN-based light emitting diodes.

However, while forming an excellent growth substrate, the GaN/sapphire system poses significant problems from the perspective of finished device performance for UV LEDs. One issue is the large lattice mismatch between the GaN buffer layer and the high aluminum content AlGaN layers that are necessary for UV LEDs (e.g. the aluminum content in the multiple quantum well active region of a 280 nm LED is as high as 50%). The UV InAlGaN heterostructure grown on GaN/sapphire are under tensile stress, which causes cracking of the AlGaN epitaxial layers when the critical layer thickness is exceeded. The critical thickness for an AlGaN film with 50% aluminum mole fraction is about 20-50 nm, which is much to thin for realizing a usable device structure. Accordingly, methods and structures such as the superlattice disclosed in the provisional U.S. patent application Ser. No. 60/736,362, titled "Superlattice Strain Relief Layer For Semiconductor Devices", referred to and incorporated by reference above, have been developed to allow increase Al content while reducing or eliminating strain induced cracking.

However, two additional problems remain. First, the sapphire substrate is electrically insulating. Therefore, for LED devices grown on sapphire substrates, all contacts must be made from the topside of the device (opposite the growth substrate). This complicates the contacting and packaging scheme and also leads to an increase in operating voltage due to the resistance of the n-AlGaN current spreading layer. This is particularly acute for deep UV emitters, as the electron mobilities decrease with increasing aluminum mole fraction, and the maximum Si-doping levels are low in AlGaN films. And second, the GaN layer is absorptive at UV wavelengths. While architecturally the goal is to provide a deep UV laser which emits from its bottom side, the absorption by the GaN layer precludes producing sufficiently high optical output.

The problems imposed by the sapphire structure have been significantly overcome by methods for removal of the substrate from the completed structure. One such method is referred to herein as a laser lift-off (LLO) process, for example as described in U.S. Pat. No. 6,757,314, which is incorporated by reference herein. One embodiment of an LLO method bonds a combination substrate/heat sink to the device topside, the surface opposite the sapphire growth substrate. A nano-pulsed excimer laser, whose energy is absorbed at the sapphire/GaN interface, is employed to rapidly heat then cool a microlayer at the sapphire/GaN interface, which decouples the substrate from the GaN layer, allowing removal of the substrate. A variation of this method first bonds an intermediate wafer to the device topside. LLO then allows for removal of the substrate, bonding the device to a heat sink/electrically conductive substrate at the surface previously occupied by the sapphire substrate, and finally removal of the device from the intermediate wafer. In such a structure, electrical contact may be made directly to the underside of the device.

However, we have discovered that a consequence of the LLO process is that the exposed surface of the GaN layer is left rough, uneven, and its plane out of parallel to the plane of the other layer interfaces. When etching, this surface morphology and orientation is translated directly to the underlying layers as the anisotropic etch proceeds. The uniform etch rate of the chemical process which removes the GaN layer means that valleys and hillocks created in the GaN layer ultimately become valleys and hillocks in the heterostructure active region where, according to one embodiment, the chemical removal process is designed to cease. These valleys and hillocks can be of significant size when compared to the thickness of the layers comprising the heterostructure active region, and indeed can render the heterostructure active region inoperable. Stopping the etch above the heterostructure active region is difficult, and even where possible, if the layer above the heterostructure active region is comprised of GaN, such as in the case where a GaN/AlN superlattice structure is employed to reduce strain in high Al layers, the remaining GaN will absorb the UV emission and effect device performance. A similar set of consequences stem from a surface plane of the GaN being out or parallel with the surface planes of the underlying layers.

Accordingly, there is a need in the art for a method of producing a deep UV light emitting device. Specifically, there is a need for a method of providing an improved surface upon completion of the removal of the substrate and etching of selected layers for a deep UV light emitting device. Removal of the substrate and GaN layers must be accomplished while also providing a suitable starting point for anisotropic etching. The method must be compatible with the general processing requirements for AlGaInN LED and laser devices, and should not significantly increase the cost or complexity of manufacturing such devices. Finally, the method must permit the formation of additional structure for, and support the ultimate formation of a LED or laser which emits light from the surface at which the growth substrate (e.g., sapphire) was initially secured.

SUMMARY OF THE INVENTION

Accordingly, within the context of semiconductor devices formed on a sapphire substrate having a GaN buffer layer formed thereover, the present invention is directed to a system and method for providing improved surface quality following LLO and etching. Following LLO and the physical removal of the sapphire substrate, a sacrificial coating such as a spin-coat polymer photoresist is applied to the exposed GaN surface. This sacrificial coating provides a planar surface, generally parallel to the planes of the interfaces of the underlying layers. The sacrificial coating and etching conditions are selected such that the etch rate of the sacrificial coating approximately matches the etch rate of GaN and the underlying layers, so that the physical surface profile during etching approximates the physical surface profile of the sacrificial coating prior to etching.

Optical devices produced by the method of the present invention exhibit efficient UV light extraction through a lowermost structural layer, such as a UV-transparent AlGaN current spreading layer. Lower operating voltages are also provided due to the lack of high series resistance layers and the vertical orientation of the device. Non-optical devices produced by the method of the present invention exhibit layers (e.g., active layers) having improved structural quality, and hence device performance and longevity.

BRIEF DESCRIPTION OF THE DRAWINGS

These and other aspects, features, and advantages of the present invention will become apparent from the following detailed description and the appended drawings in which like reference numerals denote like elements between the various drawings, but which are not drawn to scale.

FIGS. 9A through 9C illustrate steps known in the art, while FIGS. 9D through 9F illustrate steps according to an alternate embodiment of the present invention.

DETAILED DESCRIPTION OF THE INVENTION

Figure 1:
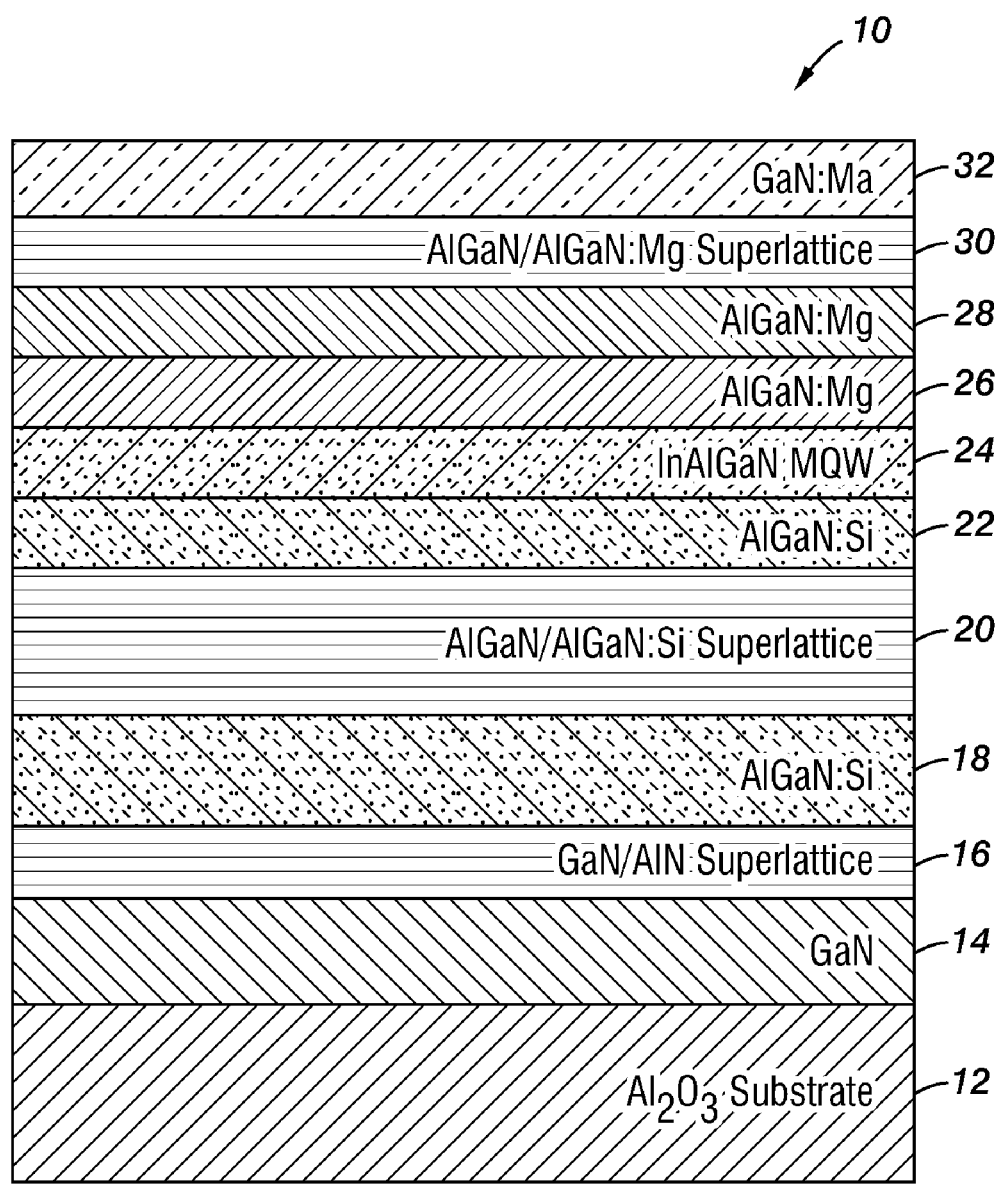
FIG. 1 is a cross-sectional view of a multiple quantum-well heterostructure light emitting diode, including a GaN/AlN superlattice, according to an embodiment known in the art.

For the purposes of explanation, the present invention will be described and illustrated staring with a foundation of a known device such as an InAlGan multiple quantum well heterostructure light emitting diode of the type illustrated in FIG. 1. It will be appreciated that the present invention finds applicability, however, with regard to many other structures such as semiconductor lasers, and many other systems such as those employing InGaN or other materials as intermediate, active (non-optical) or light emitting layers. With regard then to FIG. 1, and the exemplary LED illustrated therein, index guided, buried heterostructure AlGaInN light emitting diode structure 10 comprises an $Al_2O_3$ (sapphire) substrate 12 on which is formed a 2-10 micron thick epitaxial GaN template layer 14. GaN template layer 14 can be Si-doped or undoped and is typically grown at approximately 1100 degree C. and a reactor pressure of approximately 200 Torr. Formed thereon is a GaN/AlN short period superlattice layer (SPSL) 16 used to minimize or eliminate strain-induced cracking in subsequent high Al content layers. Formed next is AlGan:Si buffer layer 18, and formed thereon is AlGan/AlGan:Si superlattice n-strain layer 20 which allows for increased cladding thickness and hence reduced optical leakage of subsequent layers. Formed next is AlGan:Si n-cladding layer 22. InAlGan multiple quantum well active layer 24 is formed on layer 22. Formed thereon is AlGan:Mg p-cladding layer 26, then AlGan:Mg buffer layer 28. AlGan/AlGan:Mg p-strain layer 30 is next deposited, then finally a GaN:Mg capping layer is formed over the structure. The aforementioned layers may be formed, for example, as described in the aforementioned incorporated U.S. Pat. No. 6,875,627 Bour et al. It will be appreciated that a complete device will also include electrodes, not shown, as well as other similar or alternative devices formed in the manner of an array in appropriate embodiments.

The structure produced is a light emitting diode designed, for example, to emit UV light through the substrate. Since the GaN template layer 14 is absorptive at UV wavelengths, optimal device performance may be obtained by removal of substrate 12 followed by removal of GaN template layer 14. Removal of substrate 12 may preferably be accomplished by a laser lift-off (LLO) process, such as described in the aforementioned U.S. Pat. No. 6,757,314. According to one embodiment, a combination substrate/heat sink is bonded to a surface opposite the $Al_2O_3$ substrate. A nano-pulsed excimer laser is employed to rapidly heat then cool the $Al_2O_3$/GaN interface, decoupling the $Al_2O_3$ substrate from the GaN layer, allowing removal of the substrate. This is illustrated in FIGS. 2A-2C, which merely schematically illustrate a light emitting diode (i.e., not all layers thereof are shown in these FIGS.) While FIGS. 2A-2C illustrate a structure and process previously known in the art, it is helpful to describe them here so that a clear understanding of the present invention may be obtained from what follows.

Figure 2A:
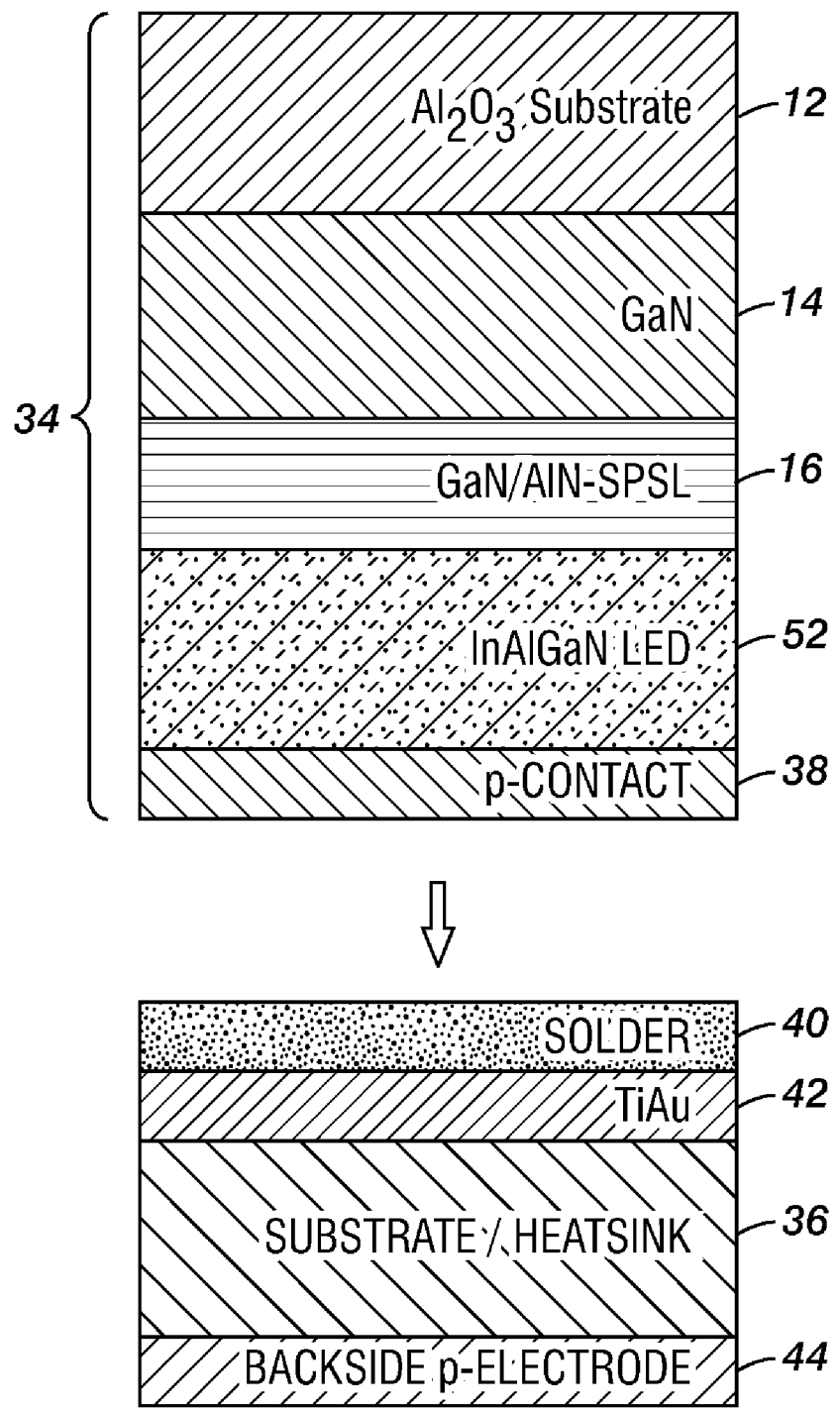
FIGS. 2A-2C are illustrations of the steps involved in a laser lift-off (LLO) process to remove the non-conductive substrate of a surface-emitting light emitting diode.

With reference first to FIG. 2A, a light emitting diode 34 (or an array of such devices) of a type described above is indirectly secured (e.g., flip-chip, thermally, or acoustically bonded) to a substrate 36 with high thermal conductivity (such as copper, diamond, bulk AlN, or silicon) to serve as a heat sink. Ideally, the first metal contact 38 (p-contact) of the light emitting diode would be bonded to a solder 40/AuTi 42 layer pair on substrate/heatsink 36 (which may or may not be patterned), with the solder reflowing or deforming to form a permanent electrical, thermal, and mechanical contact/bond between the light emitting diode 34 and substrate/heat sink 36. In some cases the substrate/heatsink may be electrically conductive as well as thermally conductive, providing an electrical contact to the first contact 38 (p-contact) of the light emitting diode structure 34. In such cases an additional contact layer 44 may be placed on the backside of the substrate/heatsink 36 to improve electrical contacting.

Figure 2B:
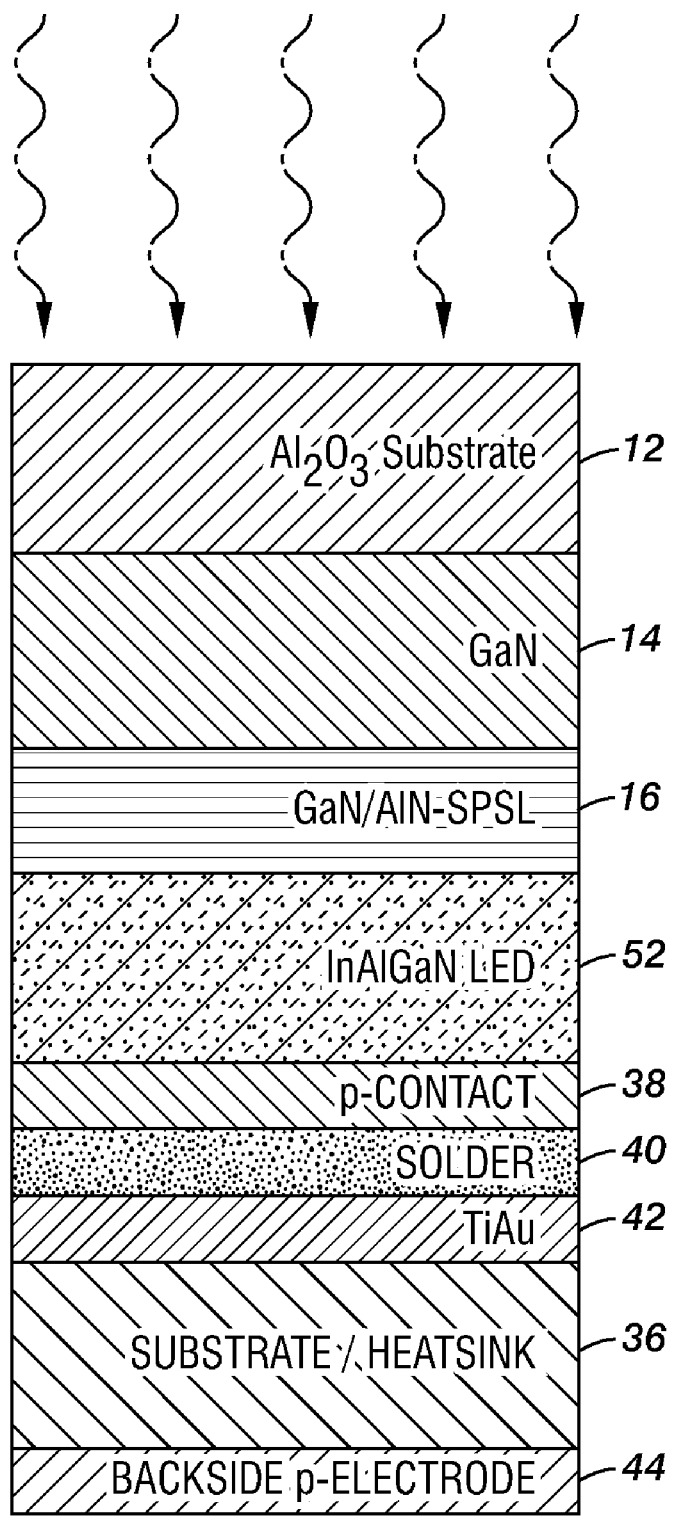
Figure 2C:
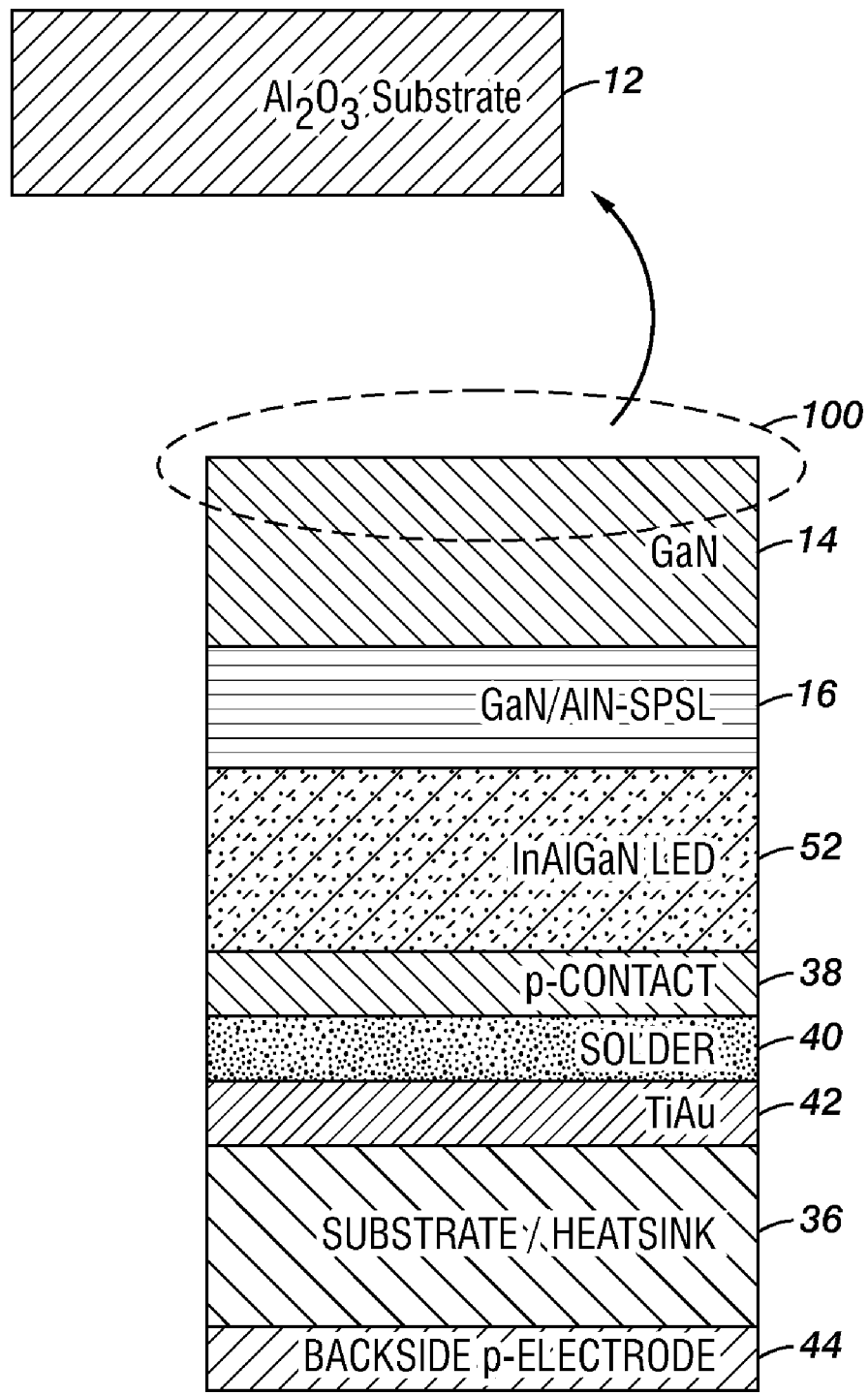

As shown in FIG. 2B, with the light emitting diode structure 34 affixed to substrate/heatsink 36, a nano-pulsed excimer laser is scanned over the $Al_2O_3$ substrate 12. Due to the bandgap between GaN and its surrounding materials, there is high absorption of the light at the interface between the $Al_2O_3$ substrate 12 and the GaN layer 14. A rapid heating then cooling at this interface occurs, which effectively results in decomposition of the GaN material at the sapphire/GaN interface, weakening or breaking the bond between the two layers. A second step to melt the transformed interface (typically at temperatures greater than the melting point of Ga (Tm~30° C.) will further weaken the interface bond. With the bond sufficiently weakened, the $Al_2O_3$ substrate 12 may simply be mechanically removed from the light emitting diode structure 34, as shown in FIG. 2C.

With the substrate removed, the GaN buffer layer is exposed. An etching process may then be employed to remove the UV absorptive GaN layer, thereby addressing the problem associated with its presence in the UV light emitting structure. However, as previously described, we have determined that a consequence of the LLO process is that the exposed surface of the GaN layer is left rough, uneven, and its plane out of parallel to the plane of the other layer interfaces. When etching, this surface morphology and orientation is translated directly to the underlying layers as the etch proceeds. The uniform etch rate of the chemical process which removes the GaN layer means that valleys and hillocks created in the GaN layer ultimately become valleys and hillocks in the heterostructure active region where, according to one embodiment, the chemical removal process is designed to cease. These valleys and hillocks can be of significant size when compared to the thickness of the layers comprising the heterostructure active region, and indeed can render the heterostructure active region inoperable. Stopping the etch above the heterostructure active region is difficult, and even where possible, if the layer above the heterostructure active region is comprised of GaN, such as in the case where a GaN/AlN superlattice structure is employed to reduce strain in high Al layers, the remaining GaN will absorb the UV emission and effect device performance. A similar set of consequences stem from a surface plane of the GaN being out of or parallel with the surface planes of the underlying layers.

In certain structures, other intervening layers may be provided between the GaN buffer layer and the heterostructure active region, such index guiding layers, current spreading layers, contact layers, etc. In these cases, the surface roughness and plane angle have a direct effect on the mode and efficiency of the light exiting a surface. Surface roughness causes undesired reflections and diffractions, and surface plane angle can effect beam profile, etc.

In the fabrication of vertical cavity surface emitting lasers, access to the backside epitaxial layer (i.e., between the GaN buffer layer and the heterostructure active region) is required for mirror fabrication. The surface roughness and plane angle of the GaN layer after LLO have a direct effect on the quality and efficacy of the subsequently formed mirror, again with an undesirably rough surface causing deleterious reflections and diffractions, beam profiles, and potentially defeating lasing within the optical cavity.

Figure 3:
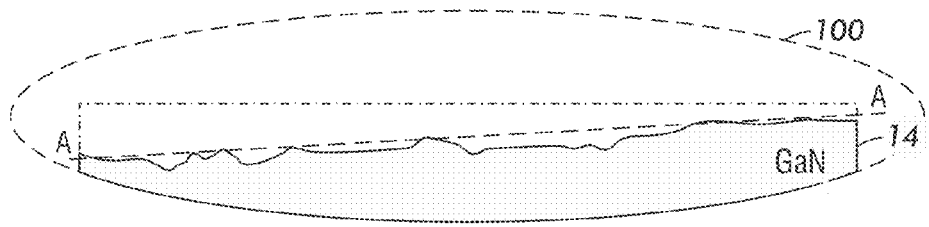
FIG. 3 is a cross-section view of the surface of a GaN layer from which a sapphire substrate has been removed by an LLO process, illustrating the surface roughness and altered plan angle of the exposed GaN surface.
Figure 4:
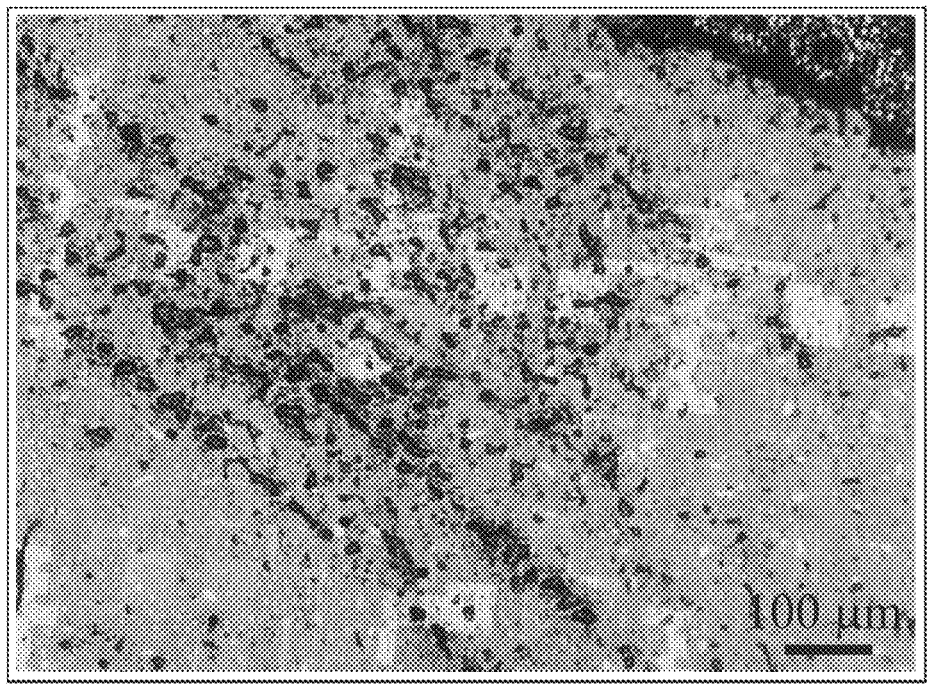
FIG. 4 is an SEM micrograph showing the valleys and hillocks (dark regions) in the surface of GaN layer from which a sapphire substrate has been removed by an LLO process.

FIG. 3 illustrates in close-up and in cross-section a region 100 from the upper surface of GaN layer 14 (FIG. 2C). While scale has been exaggerated for illustration purposes, it can be seen that the upper surface of GaN layer 14 is rough, exhibiting valleys and hillocks, and any major plane such as the plane A-A is no longer parallel to the original plane of the GaN/sapphire interface (the dashed line illustrating the approximate position and surface quality of the upper surface of the GaN layer prior to removal of substrate 12 by LLO). FIG. 4 is an actual micrograph illustrating the condition of the upper surface of GaN layer 14 following removal of substrate 12 by LLO. The dark regions indicate pits on the GaN layer surface resulting from the LLO processing. The pits are formed due to localized heating effects due to defective regions in the GaN buffer layer and due to local light intensity enhancements caused by the light passing through the sapphire substrate. Both of these effects stem mainly from the intrinsic nature of the materials.

Figure 5A:
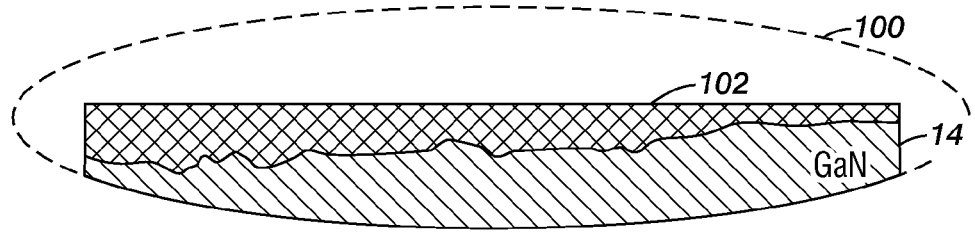
FIGS. 5a and 5B are cross-section views of the surface of a GaN layer onto which has been applied a planarization coating, before and during etching, respectively, according to an embodiment of the present invention.

With reference now to FIG. 5A, in order to counteract the surface roughness and change in plane angle of the GaN layer resulting from the LLO process, a sacrificial coating material 102 is applied to the surface of the GaN layer 14 exposed by the LLO process. Sacrificial coating 102 has several attributes. First, it is compatible with the general processing requirements for InAlGaN LED and laser devices. In particular, the process for its application does not induce additional damage into the device being fabricated, it adheres to the GaN, and the material itself does not contaminate parts of the device being fabricated. Second, the material forming sacrificial coating 102 may be dry etched using a process similar to that used to remove the GaN layer. More specifically, the etch rate can be matched, by selection of proper etch conditions, to the etch rate of the GaN layer. And third, the material and process for its deposition should not significantly increase the cost or complexity of manufacturing. One satisfactory material for sacrificial coating 102 is photoresist of a type commonly applied to the thin film or substrate surfaces by a spin-on technique. While photoresist forms one embodiment of sacrificial coating 102, it will be appreciated that other materials may serve the function of planarizing the exposed GaN surface with the requisite attributes. Such other materials include spin-on polymeric films. For example, benzocyclobutene-based polymers, polyimide, polymeric-based epoxies, polymethyl-methacrylate (PMMA) or poly vinyl alcohol [PVA] may also be used.

The thickness of sacrificial coating 102 is determined by the roughness of the surface covered, with the requirement that sacrificial coating 102 completely cover the film or substrate surface. The viscosity of sacrificial coating 102 is chosen such that the application process (e.g., the spin-on process for photoresist) is adequate to form a planar surface over the original thin-film or substrate surface. For the GaN system, Shipley 1818 photoresist is an example of a sacrificial coating 102 which meets the aforementioned requirements. Further optimization of the surface of sacrificial coating 102. may be achieved through a chemical-mechanical polishing process as an added step towards planarization. See for example, Vaudo et al., *GaN Boule Growth: A Pathway To GaN Wafers With Improved Material Quality*, Physica Status Solidi A, v 194, n 2, December 2002, p 494-7, ISSN: 0031-8965, CODEN: PSSABA.

Figure 5B:
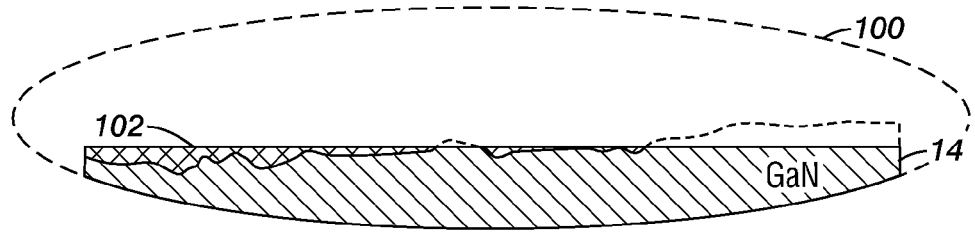

The structure may then be etched, using a dry etch process (e.g., CAIBE), to remove sacrificial coating 102 and GaN layer 14 (as well as other layers as may be appropriate for the structure under fabrication). During the etching of sacrificial coating 102, hillock peaks from the rough surface of GaN layer 14 are exposed. By choosing etching parameters that give 1:1 selectivity these peaks are etched away at the same rate as the planarized material forming sacrificial coating 102. In this way, as the photoresist is removed, the underlying rough surface is also planarized, as illustrated in FIG. 5B. Etching will eventually completely remove the coating 102, and may continue to the required depth, with the surface at the etch stop planar and approximately parallel to the planes of the other layer interfaces.

Figure 6:
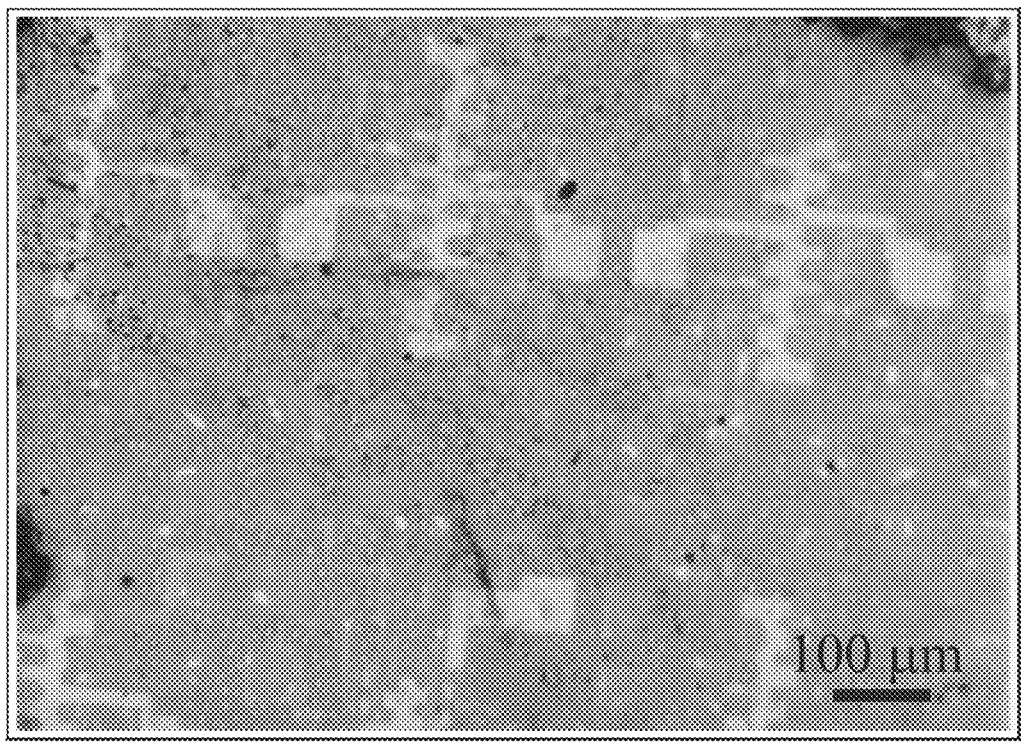
FIG. 6 is an SEM micrograph showing the valleys and hillocks (dark regions) remaining in the surface of the GaN layer shown in FIG. 4 after planarization and anisotropic etching ending at a multiple quantum well heterostructure active layer according to an embodiment of the present invention.

FIG. 6 is a micrograph illustrating the post-etch surface topology of an AlGaN:Si layer after planarization and removal of GaN layer 14 and GaN/AlN superlattice structure 16 from the device illustrated in FIG. 4. It will be appreciated that much of the surface roughness illustrated by the dark regions in FIG. 4 have been eliminated in the structure shown in FIG. 6, meaning the planarization process aided in the production of a planar surface from an originally relatively rough surface. Valleys and hillocks on the order of several micrometers in diameter and depth over a 10 µm square area have been effectively planarized by the process.

Figure 7A:
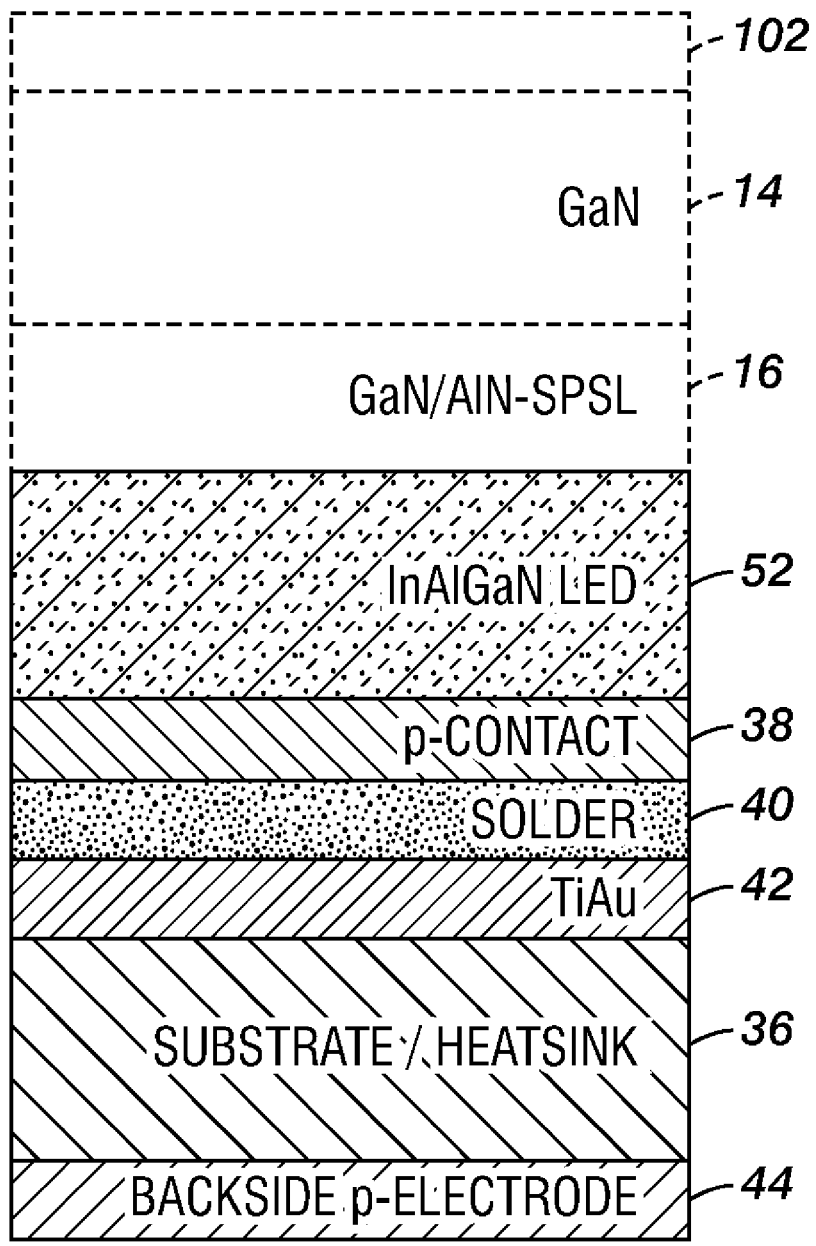
FIGS. 7A-7C are illustrations of the steps involved in the etching process to remove various layers of a surface-emitting light emitting diode above a multiple quantum well heterostructure active layer according to an embodiment of the present invention.
Figure 7B:
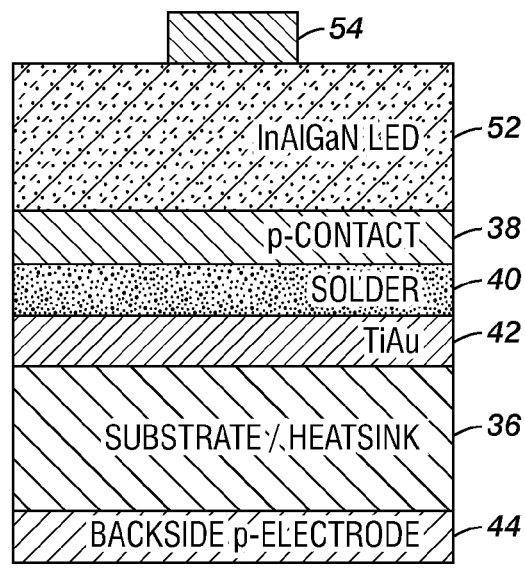
Figure 7C:
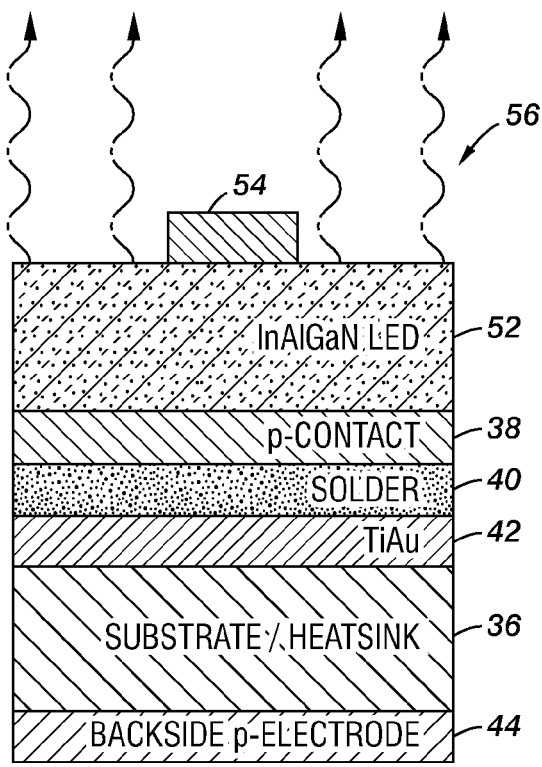

With sacrificial coating 102, GaN layer 14, and the GaN/AlN superlattice 16 removed, production of the device proceeds as illustrated at FIG. 7A with formation of a second electrical contact 54 (n-contact), patterned directly (or indirectly, over another layer or layers) on the InAlGaN light emitting diode structure 52. For example, an electrically conductive substrate 58 may be secured to the InAlGaN light emitting diode structure 52 prior to forming the contact 54. Formation of contact 54 may be achieved in a variety of ways including (but not limited to) standard photolithography or a shadow mask process. At this point the structure is as shown in FIG. 7B, and is advantageous over the prior art in that the surface upon which second electrical contact 54 is formed (or substrate 58 is secured) is substantially more planar that heretofore available. The final light emitting diode structure 56 permits light extraction through a planar surface, and electrical contact to the light emitting diode active region via the contacts 44, 54 located on opposite sides of the active region, as illustrated in FIG. 7C.

As stated above, following the removal of sacrificial coating 102, GaN layer 14, and the GaN/AlN superlattice 16, and prior to the formation of second electrical contact 54, additional layers may be formed over the device. Typically, such additional layers are part of a resonant cavity device or a vertical-cavity surface emitting laser, and such layers form a first reflective or confinement layer stack therein. These subsequent layers are typically thin-film mirror stacks which reflect light back into the cavity region. A second mirror stack opposite the first stack is also formed to define the cavity. The mirror stack is usually composed of dielectric materials such as oxides (e.g., $SiO_2$, $Ta_2O_5$) or nitrides (e.g., SiN). See U.S. Pat. No. 6,455,340, which is incorporated by reference herein.

Figure 8A:
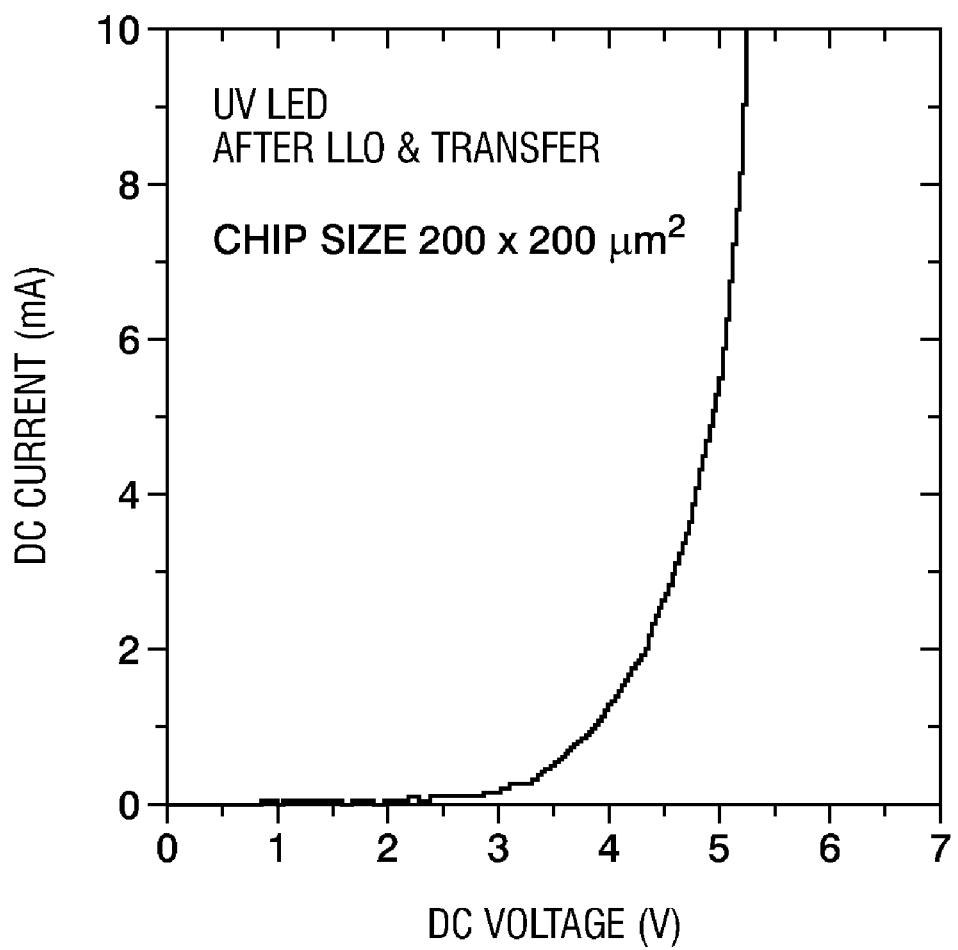
FIG. 8A and FIG. 8B are device voltage versus current performance and emission spectra graphs for a deep UV light emitting diode grown on a GaN/sapphire template with a GaN/AlN superlattice strain relief structure according to the present invention.
Figure 8B:
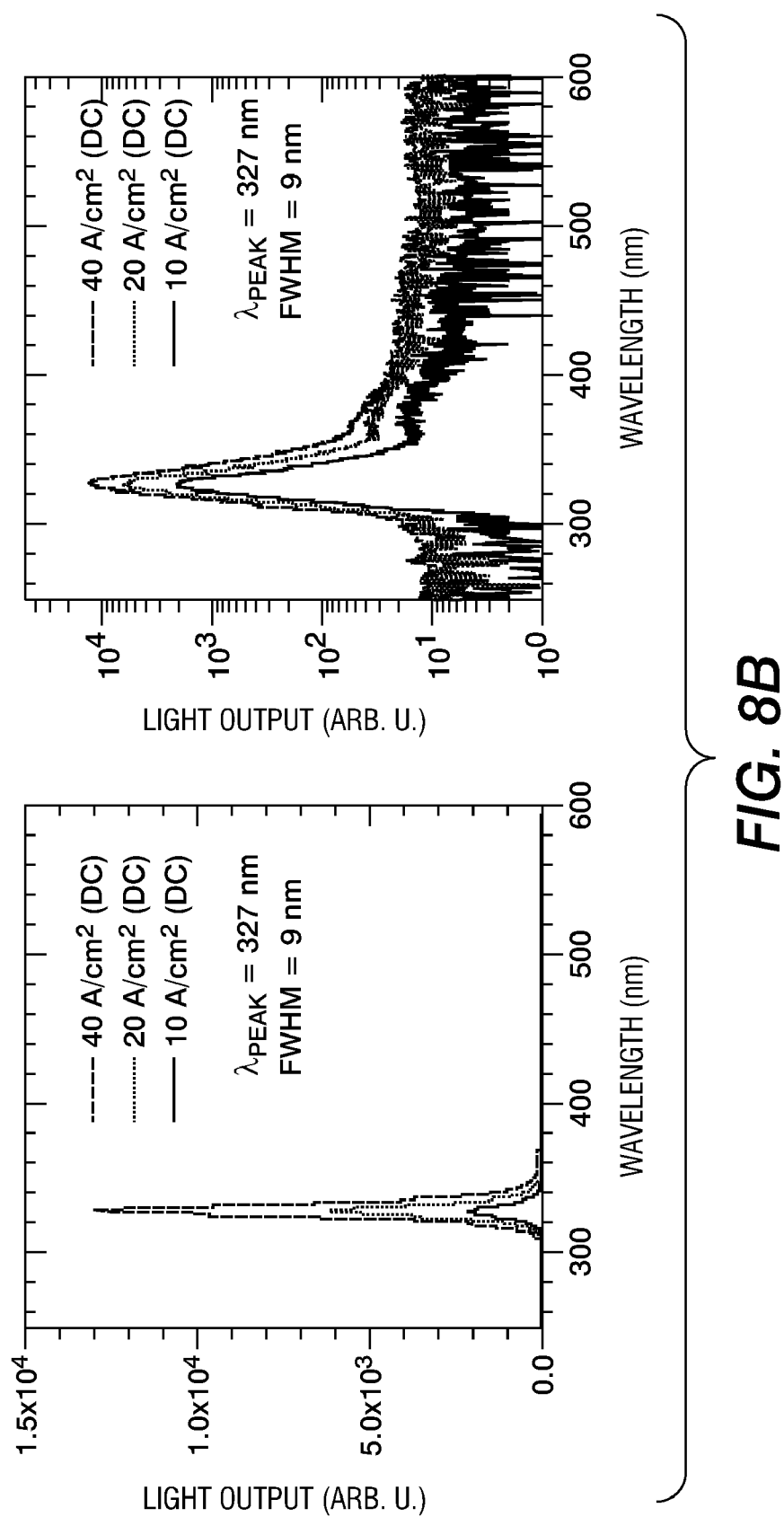

With reference to FIG. 8A device voltage versus current performance is shown for a deep UV light emitting diode grown on a GaN/sapphire template with a GaN/AlN superlattice strain relief structure according to the present invention (performance measured after removal of the substrate, etching of the GaN and GaN/AlN superlattice and transfer onto a quartz wafer) with peak emission around 327 nm. Likewise, with reference to FIG. 8B, shown therein is the emission spectra of the UV light emitting diode whose voltage-current data is shown in FIG. 8A. The characterization data shows that after LLO and transfer of the device to a quartz substrate, the Deep UV LED still has good device performance, i.e. good IV performance, and narrow and clean emission spectra which indicate overall good material and device quality.

According to another embodiment for the production of a surface emitting LED (or laser device) shown in FIGS. 9A through 9F, a UV LED structure is transferred in fabrication from a sapphire substrate to UV transparent material/substrate via an intermediate host substrate. The intermediate host substrate may be quartz, a flex substrate that facilitates integration of the LED device into larger systems, etc.

Figure 9A:
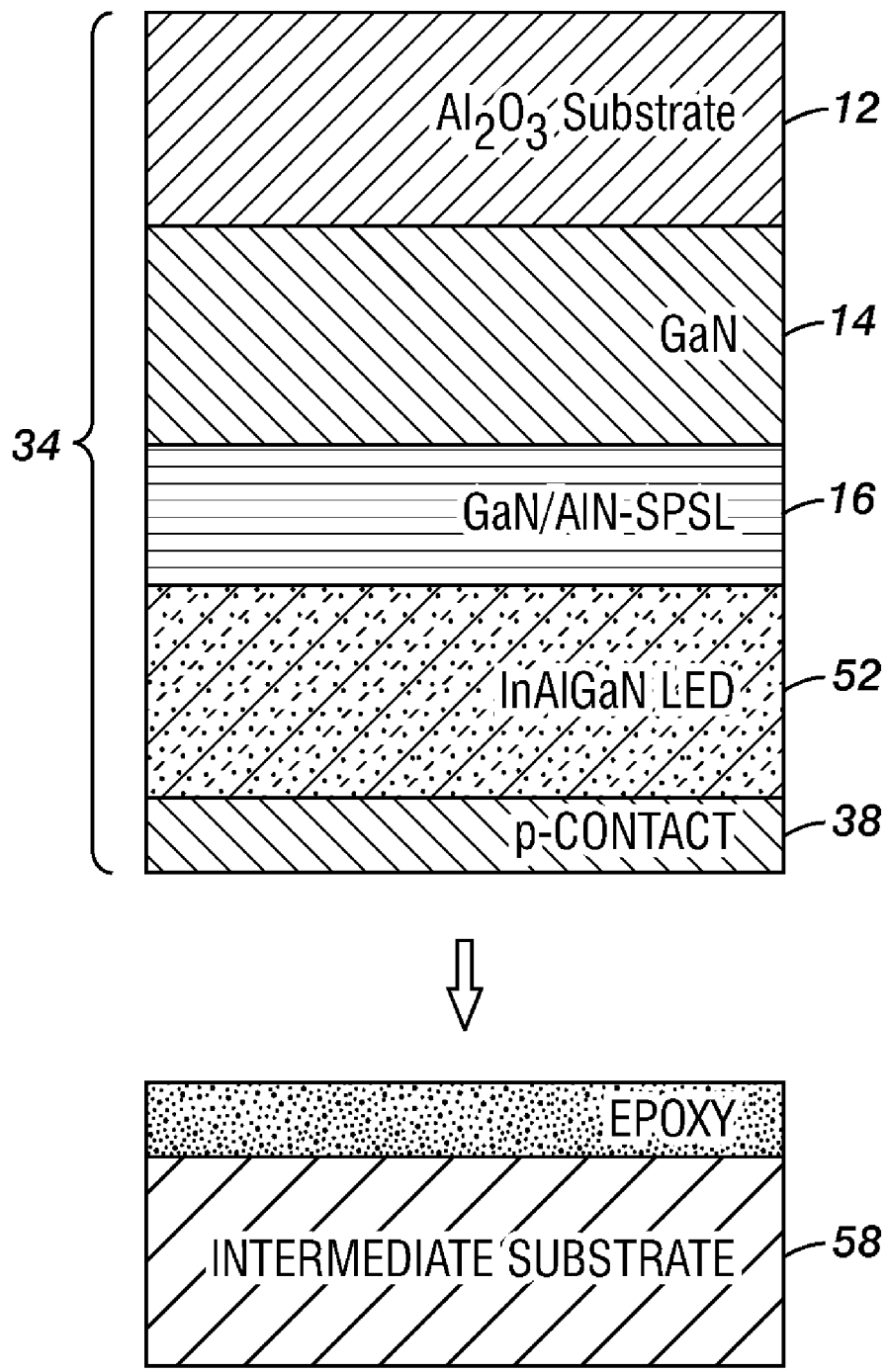
FIGS. 9A through 9F are illustrations of the steps involved in the removal and attachment of substrates to a surface-emitting light emitting diode.
Figure 9B:
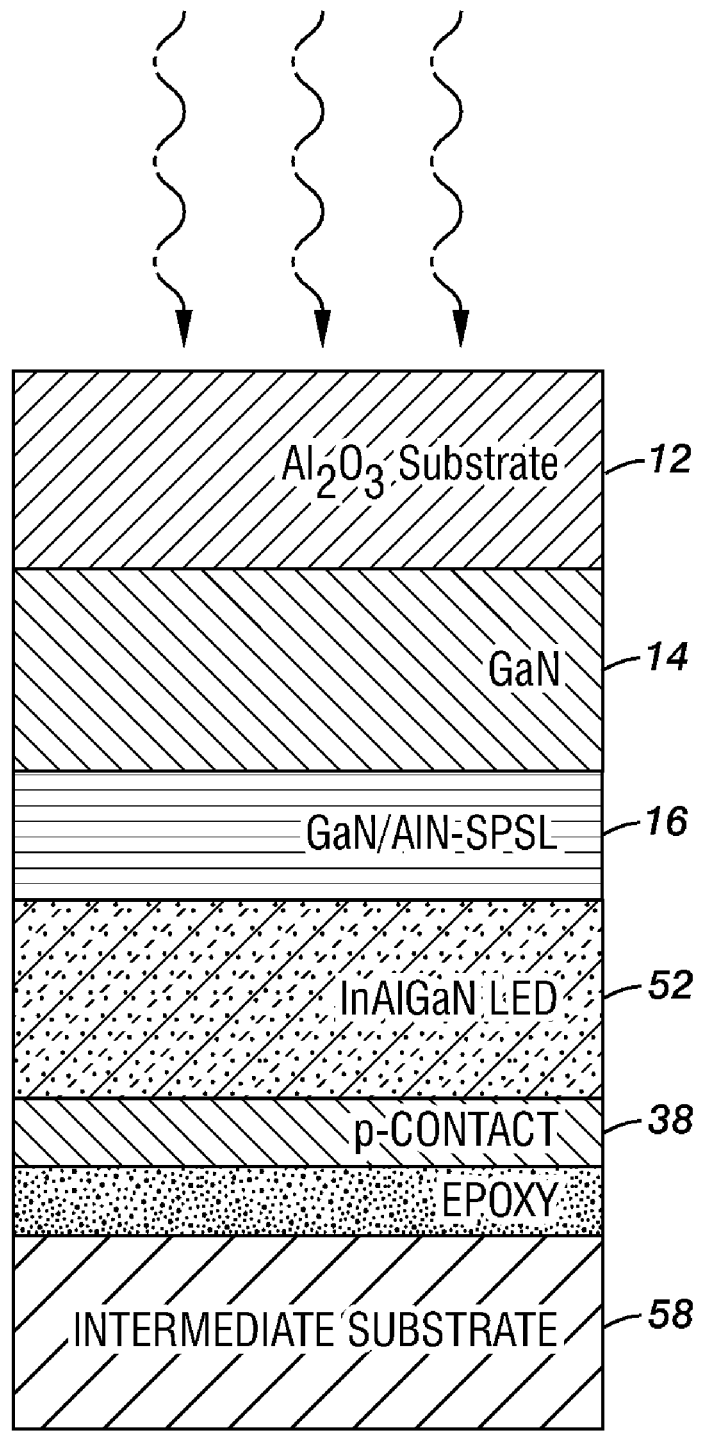
Figure 9C:
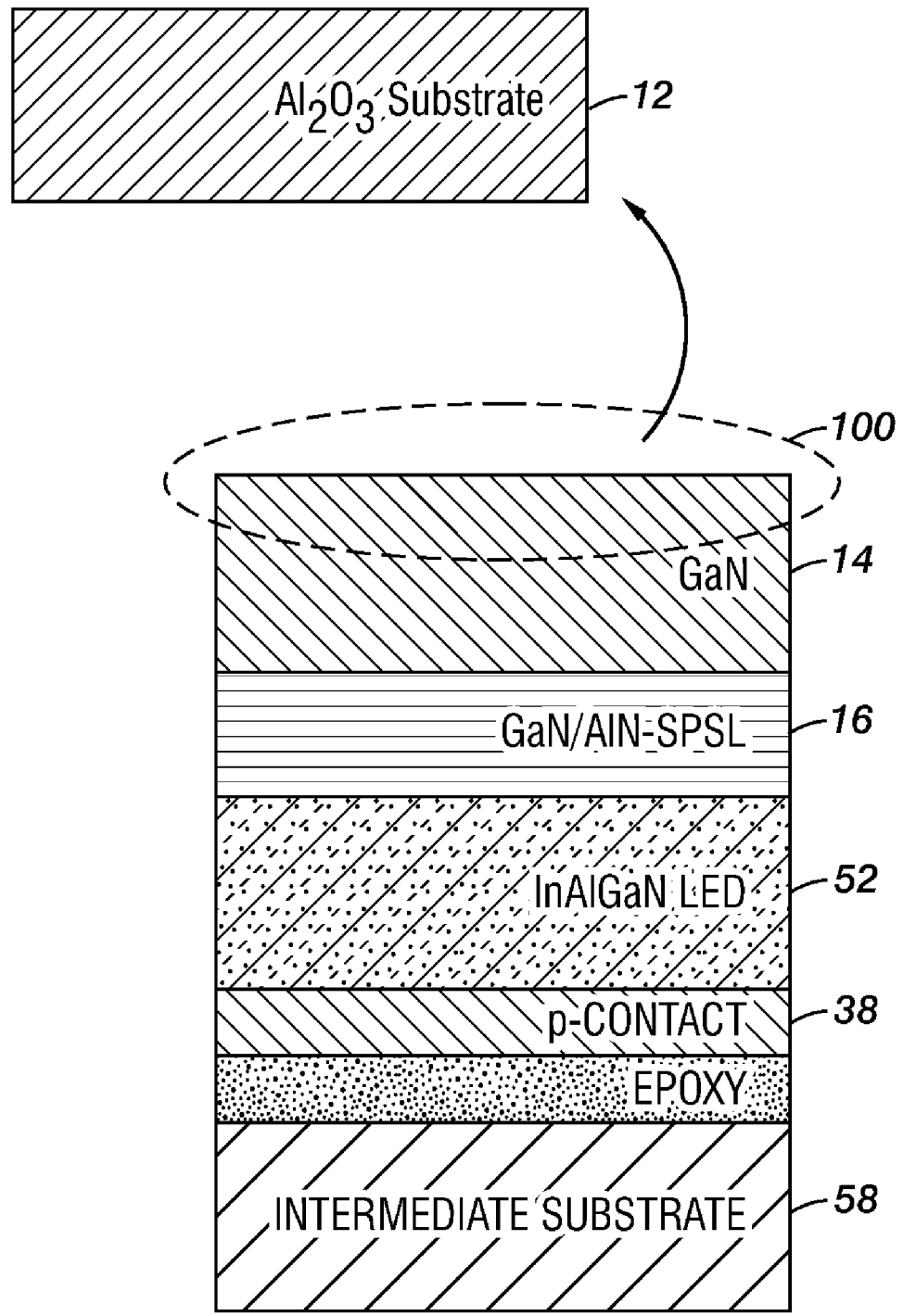
Figure 9D:
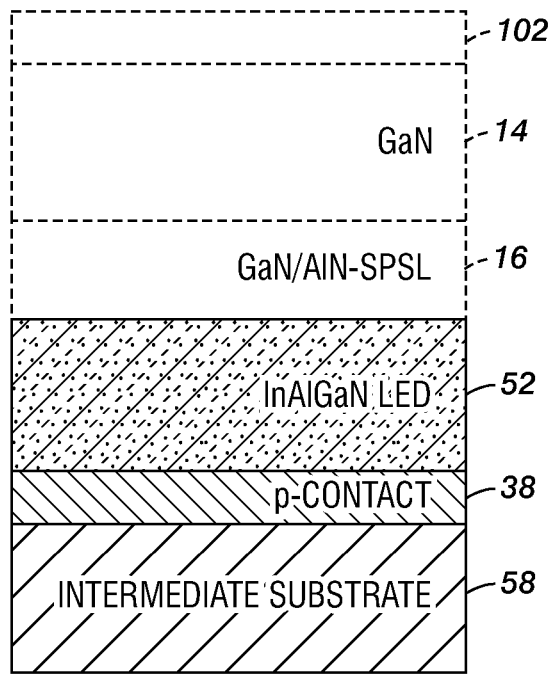
Figure 9E:
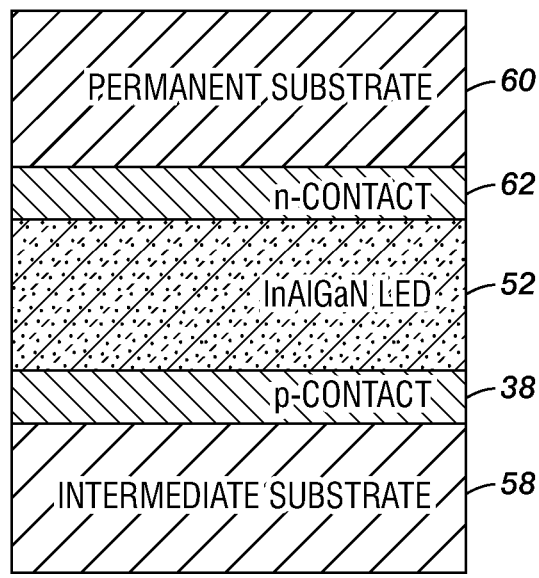

Initially, an intermediate (possibly UV transparent) substrate 58 is bonded to a surface of the UV LED structure opposite the sapphire substrate using an adhesive/epoxy, as shown in FIG. 9A. A LLO procedure is performed (as described previously), removing the sapphire substrate from the GaN layer, as shown in FIGS. 9B and 9C. The planarizing sacrificial coating 102 is then applied over the exposed GaN surface. Etching then removes the sacrificial coating 102 and selected structural layers, leaving the LED active region 52 (as well as additional layers) on the intermediate substrate, as shown in FIG. 9D. An n-contact layer 62 is then formed over the LED active region 52. Permanent substrate 60 is then bonded using a UV transparent epoxy (e.g., Epotek 301-2FL) to n-contact layer 62 (or alternatively, the substrate may form the n-contact, in which case substrate 60 is bonded directly to LED active region 52), as shown in FIG. 9E. In some instances a protective layer(s) may be applied to the lateral sides of the LED to insure the UV transparent epoxy does not bond with the intermediate substrate.

Figure 9F:
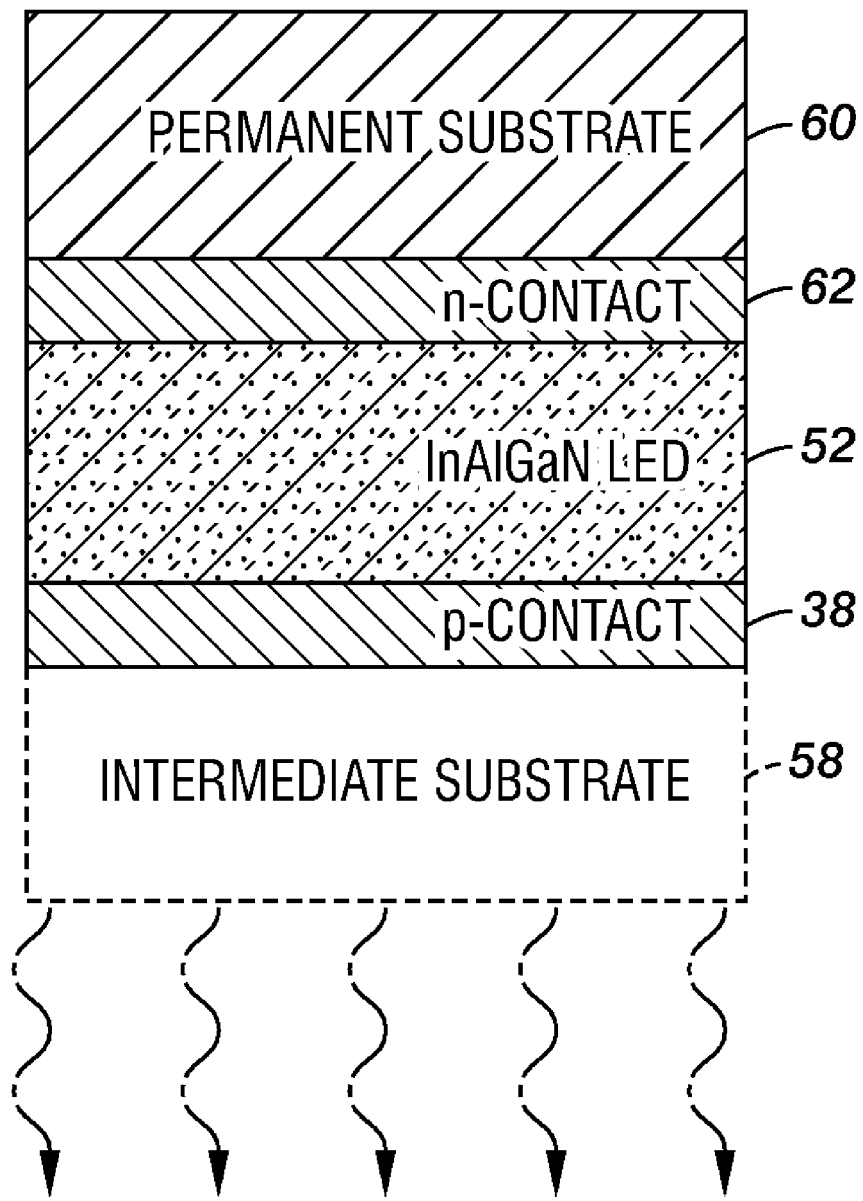

Two optional embodiments are now possible, each illustrated in FIG. 9F. In the first, the LED structure is released from the intermediate substrate 58 by emersion in a solvent (e.g., acetone) that dissolves the epoxy bonding the intermediate substrate 58 to the structure. Intermediate substrate 58 is then removed, leaving a device in which electrical contact is made from the top while light is extracted from the bottom of the device. In the second, intermediate substrate is UV transparent, and need not be removed. This also produces a device in which electrical contact is made from the top while the light is extracted from the bottom.

According to the present invention, a LLO template removal process followed by a planarization and etch process facilitates the formation of a substantially defect-free relatively high Al-content layers. While particularly useful in optical systems, the present invention may also find applicability in non-optical systems. For example, copending U.S. patent application Ser. No. 10/952,202, which is incorporated by reference herein, discloses high electron mobility transistors (HEMTs) in which a relatively high Al-content AlGaN buffer layer is formed below an undoped GaN layer. The process of the present invention applied to such a system may provide an improved quality AlGaN layer and hence improved quality GaN layer, ultimately providing improved device performance. Accordingly, another embodiment of the present invention provides a LLO template removal process followed by a planarization and etch process for the production of low defect, relatively high Al-content films useful for non-optical applications.

While a plurality of preferred exemplary embodiments have been presented in the foregoing detailed description, it should be understood that a vast number of variations exist, and that these preferred exemplary embodiments are merely representative examples, and are not intended to limit the scope, applicability or configuration of the invention in any way. For example, while described above is a light emitting diode device in production, the present invention may also be employed in the production of semiconductor laser devices in a manner consistent with that described above, as will be understood by one or ordinary skill in the art provided with the present disclosure. Accordingly, the foregoing detailed description provides those of ordinary skill in the art with a convenient guide for implementation of the invention, and contemplates that various changes in the functions and arrangements of the described embodiments may be made without departing from the spirit and scope of the invention defined by the claims thereto.

What is claimed is:

1. A method of fabricating a light emitting semiconductor device of a type which emits light in the ultra violet wavelengths from a first surface at which an $Al_2O_3$ substrate was originally located comprising:

forming a GaN buffer layer over and in contact with said $Al_2O_3$ substrate so as to create a bond at the interface between said GaN layer and said $Al_2O_3$ substrate;

forming a GaN/AlN short period superlattice layer over and in contact with said GaN buffer layer;

forming cladding and multiple-quantum-well active layers over said Ga/AlN short period superlattice layer;

securing the semiconductor device to a heat sink substrate on a second surface of the semiconductor device opposite said first surface;

weakening the bond between the GaN layer and the $Al_2O_3$ substrate by irradiating, through the $Al_2O_3$ substrate, the interface between the GaN layer and the $Al_2O_3$ substrate;

physically removing the $Al_2O_3$ substrate to thereby expose a surface of the GaN layer;

applying a planarizing coating over and in physical contact with the exposed surface of the GaN layer;

etching the planarized coating and GaN layer to at least significantly remove both; and etching said GaN/AlN short period superlattice layer such that it is substantially removed to thereby permit access to a surface exposed by said etching of said GaN/AlN short period superlattice layer;

to thereby produce said light emitting semiconductor device having said heat sink substrate located at said second surface, and light emission through said first surface.

2. The method of claim 1, further comprising, following the step of etching said GaN/AlN short period superlattice layer, forming at least one additional layer over and in physical contact with a surface exposed by said etching of said GaN/AlN short period superlattice layer.

3. The method of claim 1, wherein said planarizing coating is photoresist, which is spun onto the exposed surface of the GaN layer.

4. The method of claim 1, further comprising a step of polishing the planarized coating prior to etching.

* * * * *